United States Patent
Ishihara

[11] Patent Number: 5,001,540
[45] Date of Patent: Mar. 19, 1991

[54] THIN-FILM TRANSISTOR OPERABLE AT HIGH VOLTAGE AND A METHOD FOR MANUFACTURING THE SAME

[75] Inventor: Hiroyasu Ishihara, Tokyo, Japan
[73] Assignee: NEC Corporation, Tokyo, Japan
[21] Appl. No.: 321,923
[22] Filed: Mar. 13, 1989

[30] Foreign Application Priority Data

Mar. 11, 1988 [JP] Japan .................................. 63-57422

[51] Int. Cl.$^5$ ..................... H01L 29/78; H01L 27/01; H01L 27/13; H01L 29/10
[52] U.S. Cl. ................................ 357/23.4; 357/23.7; 357/4
[58] Field of Search ........................... 357/4, 23.7, 23.4

[56] References Cited

U.S. PATENT DOCUMENTS

| | | | |
|---|---|---|---|
| 4,232,327 | 11/1980 | Hsu | 357/4 |
| 4,300,150 | 11/1981 | Colak | 357/23.4 |

FOREIGN PATENT DOCUMENTS

| | | | |
|---|---|---|---|
| 6089674 | 5/1986 | Japan | 357/23.4 |
| 63-015467 | 1/1988 | Japan | 357/23.4 |
| 2139812 | 11/1984 | United Kingdom | 357/23.7 |
| 2201544 | 2/1987 | United Kingdom | 357/23.7 |

Primary Examiner—Andrew J. James
Assistant Examiner—Daniel Kim
Attorney, Agent, or Firm—Sughrue, Mion, Zinn, Macpeak & Seas

[57] ABSTRACT

There are disclosed a structure and a manufacturing method of a MOS-type thin-film field effect transistor composed of a substrate having an insulating main surface, a gate electrode formed on the insulating main surface to have an upper surface and a side surface at its edge, an insulating film covering at least the upper and side surfaces of the gate electrode, a semiconductor film having three continuous first, second and third portions, the first portion positioned above the upper surface of the gate electrode, the second portion being formed in contact with the insulator film at the side surface of the gate electrode and the third portion positioned above the substrate without interposing the gate electrode, a side-wall insulator formed on a part of the third portion of the semiconductor film and having a side surface contacting the second portion of the semiconductor film, and source and drain regions formed by introducing impurity atoms into the first portion and another part of the third portion of the semiconductor film, the part and the other part of the third portion being in contact with each other. The introduction of the impurity atoms is performed with use of the side-wall insulator as a mask by ion-implantation process or a process for converting insulator solution containing impurity atoms into a solid-state insulator by a heat-treatment.

4 Claims, 2 Drawing Sheets

THIN-FILM TRANSISTOR OPERABLE AT HIGH VOLTAGE AND A METHOD FOR MANUFACTURING THE SAME

BACKGROUND OF THE INVENTION

1. Field of the Invention

The present invention relates to a thin-film transistor operable at a high voltage and a method for manufacturing the same.

2. Description of the Related Art

A miniaturization of MOS-type field effect transistors becomes important, as the integration density increases. For area saving, a MOS-type thin-film field effect transistor was devised to use a step portion as its channel portion (see IEEE Transactions on Electron Devices, Vol. ED-32, No. 2 (Feb. 1985), pages 258 to 281). The structure of such thin-film transistor will be explained with reference to FIG. 1 showing a sectional view of the prior art transistor.

The MOS-type thin-film transistor is formed on a first insulating film 1 which may be a thin film formed on other substrate or a surface portion of an insulating substrate. A gate electrode 2 is formed on the first insulating film 1 with a polycrystalline silicon. A second insulating film 3 is formed on the upper and side surfaces of the gate electrode 2 so as to be used as a gate insulating layer. A polycrystalline silicon film 4 is deposited over the step portion at the edge of the gate electrode 2 so as to continuously contact with the surface of the first insulating film 1 and side and upper surfaces of the second insulating film 3. Source region 6 and drain region 7 are formed by implanting impurities. The vertical portion of the polycrystalline silicon layer 4 functions as a channel region 8.

Such MOS thin-film transistor is formed by using ion-implantation to form the source and drain regions 6 and 7. The channel region 8 has the same thickness as the polycrystalline silicon film 4. Additionally, the gate electrode 2 has a small thickness. Therefore, the drain region 7 positions very close to the source region 6, resulting in a small withstand voltage applicable to the drain region and a large leakage current flowing between the source and drain regions through the channel region.

SUMMARY OF THE INVENTION

It is, accordingly, a primary object of the present invention to provide a MOS-type thin-film field effect transistor having a miniaturized structure, a large withstand voltage and a small leakage current.

It is another object of the present invention to provide a method of manufacturing a MOS-type thin-film field effect transistor which is easily constructed to have a structure for miniaturization, a high-power operation and a small leakage characteristics.

According to a first aspect of the present invention, there is provided a MOS-type thin-film field effect transistor including an insulating body having a main surface, a gate electrode formed on the main surface, the gate electrode having a side surface and an upper surface, an insulating film formed to cover the side and upper surfaces of the gate electrode, a silicon layer continuously formed in contact with the insulating film on the upper and side surfaces of the gate electrode and extended above the insulating body exposed from the gate electrode and the insulating film to form a cranked portion, a side-wall insulator formed on the outer-side of the silicon layer at the cranked portion, and the side-wall insulator having a bottom contacting the silicon layer directly above the insulating body and a side contacting the silicon layer positioning in parallel with the side surface of the gate electrode, a portion of the silicon layer positioned in parallel with the upper surface of the gate electrode being used as one of source and drain regions and another portion of the silicon layer positioned directly above and exposed from the side-wall insulator being used as the other of the source and drain regions.

According to another aspect of the present invention, there is provided a method for manufacturing a MOS-type thin-film field effect transistor which includes the steps of forming a gate electrode on an insulating body, the gate electrode having side and upper surfaces, forming an insulating film on the side and upper surfaces of the gate electrode, forming a silicon layer on the insulating film to extend directly above the insulating body, the formed silicon layer having a cranked shape composed of a first portion positioned directly above the insulating body, a second portion positioned in parallel with the side surface of the gate electrode and a third portion positioned above the upper surface of the gate electrode, forming a side-wall insulator having a bottom contacting with the first portion of the silicon layer and a side face contacting with the second portion of the silicon layer, introducing impurity into the silicon layer with use of the side-wall insulator as a mask to form source and drain regions in the silicon layer.

The first aspect of the present invention has an offset region in the silicon layer positioned under and in contact with the bottom of the side-wall insulator. This offset region positioned between the drain region and the channel region which is a portion of the silicon layer formed in parallel with the side surface of the gate electrode. Due to the existence of the offset region, the drain withstand voltage is improved to have an increased value. A leakage current which flows between the source and drain regions through the channel region is minimized. Furthermore, according to the second aspect of the present invention, the channel region and the offset region are automatically formed by introducing impurity using the side-wall insulator as a mask. Any process requiring a precise alignment is not involved in the manufacturing procedure.

BRIEF DESCRIPTION OF THE DRAWINGS

The above and further objects, features and advantages of the present invention will become more apparent from the following detailed description taken in conjunction with the accompanying drawings, wherein.

Figure 1:
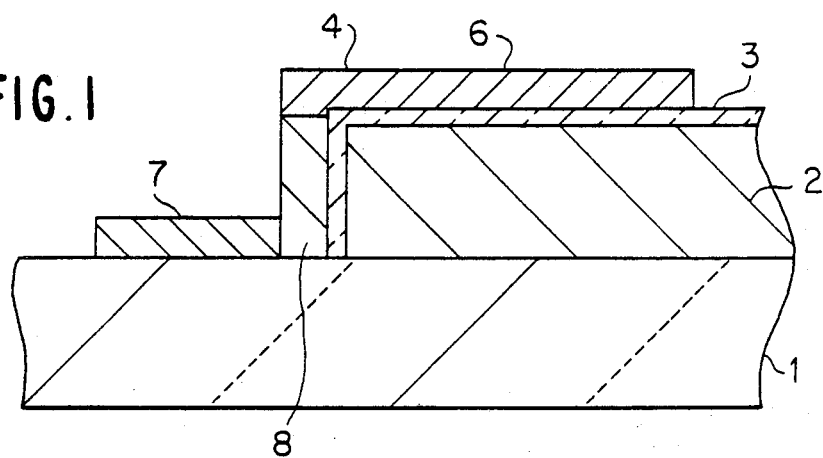
FIG. 1 is a sectional view of a MOS-type thin-film field effect transistor in the prior art.
Figure 2:
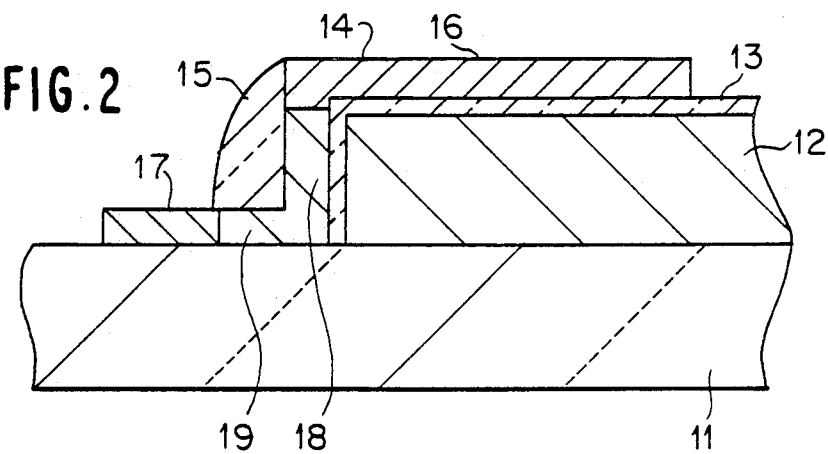
FIG. 2 is a sectional view of a MOS-type thin-film field effect transistor according to a first embodiment of the present invention.

A first preferred embodiment shown in FIG. 2 is formed on an insulating body 11 which may be an insulating substrate or a $SiO_2$ film formed on a substrate such as Si. A gate electrode 12 having a thickness of 5,000 Å is formed on the insulating body 11 with a polycrystalline silicon doped with phosphorus. The polycrystalline silicon gate electrode 12 is covered with an insulating film 13 of SiO$_2$ having a thickness of 300 Å which is, for example, formed by thermal oxidation. The insulating film 13 is alternatively formed by vapor phase deposition. A polycrystalline silicon film 14 having a thickness of 1,000 Å is formed on the insulating film 13 and is extended to the insulating body 11. The formed silicon film 14 has a cranked shape deposited along the upper surface of insulating body 11, the vertical side surface of the insulating film 13 and the horizontal upper surface of the insulating film 13. A side-wall insulator 15 is formed on the silicon layer 14 at a bent portion connecting a horizontal portion on the insulating body 11 and a vertical portion contacting with the insulating film 13 on the vertical side of the gate electrode 12. The side-wall insulator 15 has a bottom width of 2,000 Å to 5,000 Å and a height which is the same as the vertical height of the vertical portion of the silicon layer 14. The source and drain regions 16 and 17, respectively, are formed by introducing impurity into the silicon layer 14 with use of the side-wall insulator 15 as a mask. The impurity may be introduced by ion-implantation, solid-phase diffusion or vapor-phase diffusion. The impurity is, for example, boron and its concentration is, for example, $1 \times 10^{20}$ cm$^{-3}$. The source region 16 is a portion of the silicon layer 14 positioned upon the gate electrode 12. The drain region 17 is in a portion of the silicon layer 14 positioned on the insulating body 11. A channel region 18 is the vertical portion of the silicon layer 14. In the portion of the silicon layer 14 positioned on the insulating body 11, an offset region 19 exists between the drain region 17 and the channel region 18. It positions under the side-wall insulator 15 and is prevented from introducing impurity by the side-wall insulator 15.

Due to the existence of the offset region 19, the drain region 17 is kept distant from the source region 16 and the gate electrode 12. Therefore, the electric fields between the drain region 17 and the source region 16 and between drain region 17 and the gate electrode 12 are kept distant. Thus, a high voltage can be applied to the drain region 17 to allow a high power operation. By similar reason, the leakage current flowing through the channel region 18 and the offset region 19 is reduced to a very small value. The channel and offset regions 18 and 19, respectively are passivated by the side-wall insulator 15. Therefore, a very stable operation can be executed.

Figure 3A:
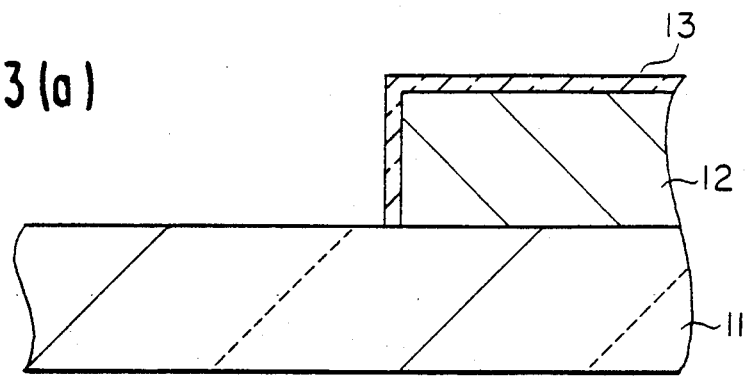
FIGS. 3(a) to 3(c) are sectional views for explaining the manufacturing process of the MOS-type thin-film field effect transistor according to the first embodiment of the present invention.
Figure 3B:
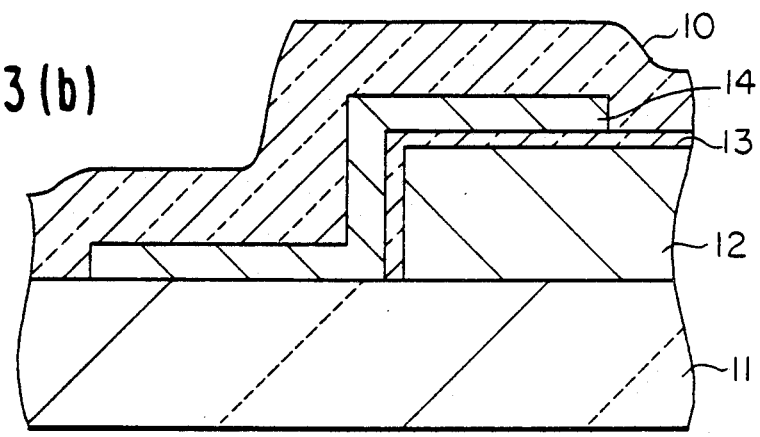
Figure 3C:
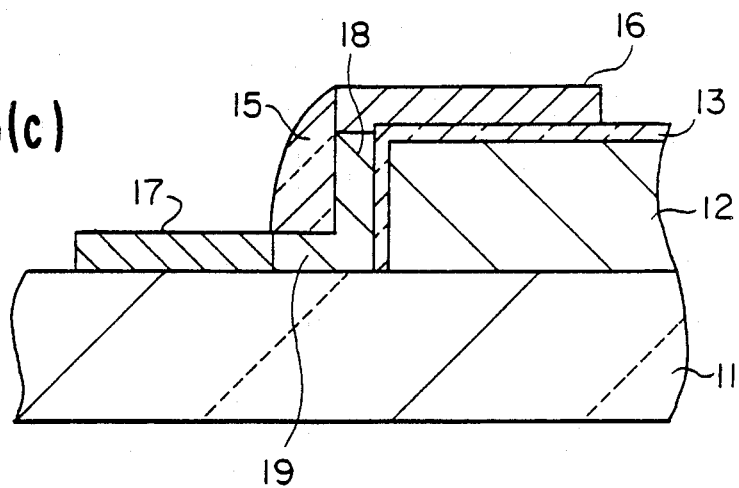

In the next place, the manufacturing process of the first embodiment shown in FIG. 2 will be explained with reference to FIGS. 3(a) to 3(c). Referring to FIG. 3(a), the insulating body 11 is an SiO$_2$ film formed on a silicon substrate (not shown). A polycrystalline silicon film is deposited on the insulating body 11 to have a thickness of 5,000 Å and is doped with impurity ions of phosphorus by thermal diffusion. A photo-etching process is subjected to the polycrystalline silicon film to form a gate electrode 12. The surface of the gate electrode 12 is converted into an insulating film 13 of SiO$_2$ by thermal oxidation of polycrystalline silicon. The preferable thickness of the insulating film 13 is 300 Å. The insulating film 13 may be alternatively deposited by vapor-phase deposition.

Thereafter, another polycrystalline film 14 is deposited over the exposed surface of the insulating body 11 and the insulating film 13. The polycrystalline silicon film 14 is shaped to have a cranked form, as shown in FIG. 3(b), by another photo-etching process. The cranked form is automatically obtained by using the edge portion of the gate electrode 12. The shaped silicon film 14 has an upper horizontal portion positioning above the gate electrode 12, a vertical portion positioning in parallel with the side edge of the gate electrode 12 and a lower horizontal portion positioned on the exposed surface of the insulating body 11. An insulator 10 such as SiO$_2$ is deposited over the whole surface with a thickness of 2,000 Å by vapor-phase deposition. The insulator 10 is anisotropically etched by a reactive ion-etching process to form a side-wall insulator 15 shown in FIG. 3(c). The side-wall insulator 15 has a bottom having a width of 2,000 Å contacting with the lower horizontal portion of the shaped silicon film 14 and has a vertical side contacting the vertical portion of the shaped silicon film 14. Impurity ions of boron are implanted into the silicon film 14 using the side-wall insulator 15 as a mask. The preferable impurity concentration of the implanted regions is about $1 \times 10^{20}$ cm$^{-3}$. The upper horizontal portion of the shaped silicon film 14 is thus doped and used as a source region 16. A part of the lower horizontal portion of the shaped silicon film 14 which is exposed from the side-wall insulator 15 is also doped to be used as a drain region. The other part of the lower horizontal portion of the shaped silicon film 14 which positions under the side-wall insulator 15 is undoped to be used as an offset region 19. The vertical portion of the shaped silicon film 14 is a channel region of which conductivity is controlled by the gate electrode 12.

As explained above, the positioning of the source, drain, offset and channel regions are defined by self-alignment. Any precise control of positioning is not required to facilitate the manufacturing process.

Figure 4:
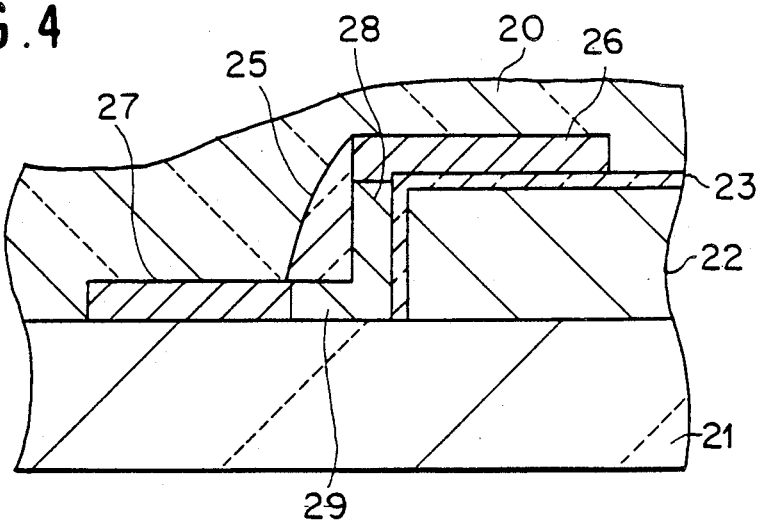
FIG. 4 is a sectional view of a MOS-type thin-film field effect transistor according to a second embodiment of the present invention.

According to a second embodiment of the present invention which is shown in FIG. 4, a passivation film 20 of SiO$_2$ is covered over the whole structure which has a similar structure to a MOS-type thin-film field effect transistor shown in FIG. 2. That is, a polycrystalline silicon gate electrode 22 is formed on an insulating body and is covered with an insulator film 23 of oxidized SiO$_2$. A cranked shape silicon film is formed at the edge of the gate electrode 22 to have a lower horizontal portion on the insulating body 21, a vertical portion at the side edge of the gate electrode 22 and an upper horizontal portion on the gate electrode 22. A side-wall insulator 25 is formed on the corner of the cranked shape silicon film between the lower horizontal portion and the vertical portion.

Here, turning back to the passivation film 20, it is formed by applying a solution containing silica and boron over the whole surface and then being subjected to a heat treatment to convert the solution into a boron-doped SiO$_2$ film. During this heat treatment, the doped boron diffuses into the silicon film to form a source region 26 and the drain region 27. The side-wall insulator 25 acts as a mask for diffusion of boron. The SiO$_2$ film 20 is usable as a passivation film or an inter-layer insulating film on which wiring layer is formed.

Thus, according to the second embodiment of the present invention, the impurity diffusion for source and drain regions and the formation of the passivation or inter-layer insulating film are simultaneously achieved, resulting in less process steps.

It is needless to say that the insulating films 13 and 23 may be formed by vapor-phase deposition. In this case, the insulating films 13 and 23 extend over the insulating body 11 and 21, respectively, on which the drain regions 17 and 27 and the offset regions 19 and 29 are formed. The similar effects and advantages to the first and second embodiments of the present invention can be obtained in this modification. The introduction of impurity into the source and drain regions can be performed by diffusion from vapor-phase. The length of the offset region, that is, a width of the bottom of the side-wall insulator is arbitrarily selected but is effective on operation if it is from 2,000 Å to 5,000 Å. Other dimensions such as thickness, length and width of the gate electrode 12, 22 and source, channel, offset and drain regions may be arbitrarily selected.

What is claimed is:

1. A MOS-type thin-film field effect transistor comprising:
   a substrate having an insulating main surface;
   a gate electrode formed on said insulating main surface, said gate electrode having an upper surface and a side surface at an edge;
   an insulating film covering at least said upper and side surfaces of said gate electrode;
   a semiconductor film having three continuous portions of first, second and third portions, said first portion being positioned above said upper surface of said gate electrode, said second portion being formed in contact with said insulator film at said side surface of said gate electrode and said third portion being positioned above said substrate without interposing said gate electrode;
   a side-wall insulator formed on a first part of said third portion of said semiconductor film and having a side surface contacting said second portion of said semiconductor film, said first part of said third portion being in contact with said second portion;
   a source region formed by introducing impurity atoms into said first portion; and
   a drain region formed by introducing said impurity atoms into a second part of said third portion, said second part being exposed from said side-wall insulator and being in contact with said first part.

2. A MOS-type thin-film field effect transistor as claimed in claim 1, wherein said gate electrode and said semiconductor film are formed of polycrystalline silicon.

3. A MOS-type thin-film field effect transistor as claimed in claim 2, wherein said side-wall insulator has a bottom contacting with said first part of said third portion of said semiconductor film, said bottom having a width selected from a range between 2,000 Å and 5,000 Å.

4. A MOS-type thin-film field effect transistor as claimed in claim 2, further comprising an insulator cover covering said semiconductor film and said side-wall insulator, said insulator cover containing said impurity atoms which are same as introduced into said source and drain regions.

* * * * *